(12) United States Patent
Finch

(10) Patent No.: US 8,089,053 B1
(45) Date of Patent: Jan. 3, 2012

(54) DYNAMICALLY TILTING SPECIMEN HOLDER FOR STEREO AND TOMOGRAPHIC IMAGING IN A TRANSMISSION ELECTRON MICROSCOPE USING A COMBINATION OF MICRO ELECTRO MECHANICAL SYSTEMS (MEMS) AND PIEZOELECTRIC TRANSDUCERS (PZTS)

(75) Inventor: Dudley Sean Finch, Ashland, OR (US)

(73) Assignee: Dudley Finch, Ashland, OR (US)

( * ) Notice: Subject to any disclaimer, the term of this patent is extended or adjusted under 35 U.S.C. 154(b) by 48 days.

(21) Appl. No.: 12/590,502

(22) Filed: Nov. 10, 2009

(51) Int. Cl.
*G01D 1/16* (2006.01)
*G01L 7/00* (2006.01)

(52) U.S. Cl. ............... 250/440.11; 250/442.11; 850/1; 850/2; 850/3; 850/52; 850/53

(58) Field of Classification Search ............ 250/440.11, 250/442.11; 850/1, 2, 3, 52, 53
See application file for complete search history.

(56) References Cited

U.S. PATENT DOCUMENTS

| | | | | |
|---|---|---|---|---|
| 6,590,212 B1* | 7/2003 | Joseph et al. | ............... | 250/311 |
| 6,674,077 B1* | 1/2004 | Joseph et al. | ............... | 250/311 |
| 7,752,916 B2* | 7/2010 | Han et al. | ............... | 73/789 |
| 7,843,108 B2* | 11/2010 | Suzuki | ............... | 310/309 |
| 7,884,526 B2* | 2/2011 | Suzuki | ............... | 310/309 |
| 2005/0264877 A1* | 12/2005 | Mandella et al. | ............... | 359/385 |
| 2007/0278420 A1* | 12/2007 | Molhave | ............... | 250/442.11 |
| 2010/0006958 A1* | 1/2010 | Krylov et al. | ............... | 257/415 |
| 2010/0017921 A1* | 1/2010 | Rangelow et al. | ............... | 850/1 |
| 2010/0064765 A1* | 3/2010 | Han et al. | ............... | 73/1.15 |

* cited by examiner

*Primary Examiner* — David A Vanore

(57) ABSTRACT

The present invention relates to double-tilt specimen holders of the side-entry type for transmission electron microscopy (TEM). The invention uses Micro Electro Mechanical Systems (MEMS) and Piezoelectric Transducer (PZT) technology to create a digitally programmable dynamically tilting specimen holder integrated into a standard transmission electron microscope stage.

In this invention, specimens can be tilted using a MEMS/PZT-actuated specimen holder to between 10 and 25° for stereo pairs and at higher angles (up to 90°) for tomography applications. In one embodiment, the specimen cradle may be effectively rotated 360° about the Y axis, enabling virtually the complete three-dimensional mapping of a specimen. By incorporating closed-loop capacitive feedback sensors for sub-nanometer positional control, the specimen holder allows rapid movement and full digital control of specimen tilt, enabling a number of novel techniques including real-time stereo imaging, auto crystal plane alignment and zero loss imaging.

11 Claims, 11 Drawing Sheets

DYNAMICALLY TILTING SPECIMEN HOLDER FOR STEREO AND TOMOGRAPHIC IMAGING IN A TRANSMISSION ELECTRON MICROSCOPE USING A COMBINATION OF MICRO ELECTRO MECHANICAL SYSTEMS (MEMS) AND PIEZOELECTRIC TRANSDUCERS (PZTS)

FIELD OF THE INVENTION

This invention relates to specimen holders for transmission electron microscopy (TEM). The invention utilizes Micro Electro Mechanical Systems (MEMS) and Piezoelectric Transducer (PZT) technology to create a dynamically tilting, digitally programmable specimen holder with closed-loop feedback sensors for sub-nanometer positional control incorporated in a standard transmission electron microscope stage.

BACKGROUND OF THE INVENTION

Transmission electron microscopy is a technique widely used in the disciplines of biological and materials sciences. At its core, it relies on the ability to image through an object, following the interaction of electrons with the specimen. This allows the operator to observe a specimen at high spatial resolution for the purpose of identifying composition and structure in relation to a macroscopic property. An example in biological sciences is the study of the chemical synapse of the neuron, whereby transmission electron microscope images of the synapse aid the understanding of complex chemical processes in cell-to-cell signaling. An example in the materials science field would be using a transmission electron microscope to image an interface between two or more materials in an attempt to understand the relationship between the interfacial structure and some externally measured macroscopic physical property. In both examples, the ability to obtain images in three dimensions assists the user in determining the spatial relationship between discrete elements of an image, therefore providing a better understanding of complex interactions occurring at length scales ranging from micrometers (μm) to picometers (μm).

Specimen holders for the TEM are of two distinct types: top-loading and side-entry. In the case of a top-loading specimen holder, the TEM specimen is loaded vertically into the TEM via a complex transfer mechanism. The principal advantage of top-loading specimen holders is their lack of direct connection to the exterior surfaces of the TEM, resulting in less holder drift, which is an important consideration when obtaining high-resolution TEM images. However, the majority of microscopes that operate up to 400 keV utilize side-entry specimen holders since these offer significantly greater advantages. Generally, side-entry specimen holders are larger, therefore allowing more complex manipulation of the specimen, such as rotation and strain application, and increasing the ability to perform X-ray analysis (EDS).

The most basic of TEM holders for analyzing specimens is the single-tilt holder. Besides allowing movement in the Z plane for adjusting the height of the specimen to a eucentric position, basic specimen holders are limited to movement in the X or Y planes perpendicular to the electron beam and to plus/minus rotation in the longitudinal direction of the X axis. These holders are typically robust and reliable. They can give the user some information as to the behavior of the specimen under the electron beam. This would include changes in diffraction contrast with rotation about the X axis.

However, with the need for more advanced analytical TEM techniques, the information derived from a single-tilt holder is often too limited. This is particularly true when imaging or performing diffraction studies of crystalline materials. In this case, users would opt for a double-tilt holder in which the two tilt angles are perpendicular to each other. This allows tilting of a crystalline specimen to a degree that alignment with a particular crystallographic orientation is possible. Such holders utilize mechanical means to tilt the specimen in the Y axis as well as the X axis.

In certain cases, in addition to tilting, it is necessary to rotate the specimen. Two examples of this would be using electron tomography for three-dimensional reconstruction, and stereo pair imaging for the analysis of planar structures such as grain boundaries and interfaces. In both cases, the specimen is rotated until the features of interest align with the tilt axis of the specimen holder. Holders that are capable of rotating the specimen in combination with tilt along a single axis have been commercially available for some time. More recently, holders that can combine rotation with tilt along two axes have become available. These address the specific need for the stereological analysis of crystalline materials when, as the user tilts the specimen, the contrast changes, therefore complicating the analysis. To reduce this effect, the user can rotate and align the tilt axis to the specimen's g vector. Using this approach of rotating and tilting the specimen has a reduced impact on changes in diffraction contrast conditions.

There are two primary methods for obtaining three-dimensional images in a transmission electron microscope: stereo pairs and tomography. Stereo pairs are typically derived from tilting a specimen over a range of +/−10° to as much as +/−25°, with an image taken at both outermost angles. Applying the known tilt angle, the microscopist can then overlay these two images using either an analog or a digital technique so that the left and right eyes separately, rendering a three-dimensional image to the viewer.

In the case of tomography, a high-tilt tomography holder is used to tilt the specimen over a range of +/−70° to +/−80°. Images are obtained at predetermined angular increments, often as little as 1°, and then reconstructed digitally to give a three-dimensional representation of the specimen. Fiducial markers, often in the form of gold nanoparticles, are placed on the specimen and used as reference markers to assist in aligning each image within the tomogram. Besides biological applications such as the analysis of the neuronal synaptic junction, tomography is utilized by materials scientists for the three-dimensional reconstruction of the arrangement of atoms; for example, to study nanoscale materials, particles or interfaces. To collect tomograms at high magnification and with atomic resolution is particularly challenging. The field of view may be as small as 25×25 nm and features of interest such as vacancies or atoms in the region of 1 nm or less.

When trying to move the specimen over small distances, two major limitations in current tilt-and-rotate holders dominate. These are backlash and stiction. Backlash is uncontrolled movement associated with the inherent lack of precision in the mechanical drive mechanism, and stiction is static friction associated with mechanical contact between materials surfaces.

In current designs, there are no intrinsic mechanisms for digitally driving the specimen holder since there are no real-time feedback systems to identify the position or orientation of the holder. That is not to say that such a feedback mechanism could not be introduced into current holder design. Its lack of inclusion is more than likely associated with the current philosophy of simplicity and reliability of mechanical systems and the desire to minimize electromagnetic interference (EMI) near the specimen.

The advantages of introducing micromachined MEMS technology into current holder designs would include both digital control as well as the ability to move small distances reliably and routinely. The recent introduction of silicon-on-insulator (SOI) processes in MEMS devices has led to the development of inchworm drives that are capable of moving structures relatively large distances (several mm) and with high precision (40+nm per iterative step). However, this technology alone suffers from a general lack of sufficient applied force to move a beam or cantilever, and only with careful design is it possible to overcome stiction.

In addition to MEMS-based technology, this invention utilizes PZT technology, which can generate sufficient power to move MEMS-based structures and, depending on the applied voltage, can control movements in the 10-nanometer to several-micrometers range, ideal for controlled specimen tilt in TEM holders. The degree of tilt is governed by the design of the MEMS device and the applied voltage on the PZT. More specifically, this invention addresses the inability of commercially available specimen holders to allow rapid tilting forward and backward of the specimen within the electron beam to produce real-time stereo or tomographic images.

To the human eye, producing an image refreshed at 50 frames per second (i.e. every 20 milliseconds) would be interpreted as a real-time image to the brain. By integrating MEMS into the TEM specimen holder, the specimen can be tilted over a defined angle at up to 1000 cycles per second. By synchronizing the rapid dynamic tilt of the specimen with image collection on a CCD camera, real-time stereo images and tomograms can be obtained. This method of image collection can have a significant impact when dealing with electron beam-sensitive materials such as biological materials and polymers. In addition to collecting three-dimensional images, using this approach also makes it possible to collect a time series of images. This offers the user the opportunity to determine the relative beam sensitivity of components of an image through changes in structure or contrast as a function of time or electron dose. By following the change in the image as a function of time and/or dose, the user would be able to compute and reconstruct a zero dose image.

SUMMARY OF THE INVENTION

This invention meets the need for a rapid-tilt, digitally controlled specimen holder that is integrated into a standard side-entry TEM specimen holder using a combination of MEMS and PZT technology.

The specimen, when mounted in a MEMS/PZT-actuated specimen holder, can be tilted in the Y axis perpendicular to the electron beam. The use of MEMS/PZT technology in the immediate vicinity of the specimen eliminates the need for an externally powered drive shaft for translation, reducing mechanical vibration and stiction. In addition, incorporating MEMS/PZT technology into the tilting specimen holder allows complete digital measurement and control of specimen movement with high precision that is programmable. Both MEMS and PZTs are intrinsically vacuum compatible and offer a fast response time. The MEMS components produce relatively long (several micrometers) displacements in a compact space but do not produce sufficient force for translation. PZTs add the advantage of providing sufficient power for movement and produce no electromagnetic fields, which could deflect the electron beam and impact imaging and analysis.

In one design, the invention requires the provision of a commercially available side-entry single-tilt specimen holder for transmission electron microscopy, which includes a mechanism for tilting the specimen about the X axis. In addition, the following components are incorporated:

A specimen cradle held in a specimen holder frame;
A MEMS/PZT-based mechanism for tilting the specimen cradle about the Y axis; and,
Closed-loop capacitive feedback sensors for sub-nanometer positional control.

In a commercially available double-tilt specimen holder, tilt about the X axis is achieved by a drive mechanism for rotating the support rod about the longitudinal axis. The Y tilt axis is comprised typically of a mechanical drive for moving a drive shaft linked via a spherical bearing to the frame housing the specimen cradle.

In this invention, tilting of the specimen about the Y axis is accomplished by a combination of MEMS and PZT devices. In the preferred embodiment, the rotational mechanism is comprised of several MEMS-based clutches that serve to grip an actuator arm. Movement of the actuator arm is achieved by a combination of MEMS and PZT actuation. This movement subsequently applies a torsional force to a support beam causing it to rotate about the Y axis. Since the support beam is connected to the specimen substrate, this in turn causes the specimen to tilt.

The design and number of MEMS-based clutches required depends on the rotational resistive forces. The present invention utilizes eight pairs of MEMS-based clutches, which could be increased or decreased in number as needed in keeping with optimizing the performance of the design. The key element to the design is that each MEMS-based clutch should be capable of gripping the actuator arm without applied power. In the preferred embodiment, eight pairs of MEMS-based clutches have compressed MEMS springs and a clutch plate to grip the actuator arm. Releasing the clutch involves applying power to an actuator such as a comb drive that subsequently pulls the clutch plate from the actuator arm. Upon removing power, the MEMS springs return the clutch plate into direct contact with the actuator arm.

Applying a tangential force to the actuator arm gripped by the MEMS-based clutch enables rotation of the support beam attached to the specimen frame. MEMS devices in the form of a comb drive or thermal actuator can be used to apply the tangential force; however, this approach is challenging in terms of developing sufficient force and overcoming the difficulty of achieving nanometer scale displacements. For these reasons, the preferred embodiment, incorporates a PZT driver to deliver the tangential force to the actuator arm. The exact displacement depends on the applied voltage to the PZT, with displacements varying typically between 10 nm and several micrometers.

Following actuation of the PZT drivers for tilting the specimen cradle, the preferred embodiment incorporates a mechanism to reset each clutch independently or as a group. This involves applying a voltage to the clutch, allowing it to disengage from the specimen cradle and reverse movement of the PZT. Resetting the clutches in pairs ensures that no slippage of the specimen cradle occurs prior to the next actuation sequence. In the preferred form, the tilting of the specimen cradle is under digital control and therefore easily integrated into software so that there is a direct connection between the image of the specimen and the specimen tilt about the Y axis.

This embodiment allows the user to identify a feature in the image, then program the holder to tilt the feature a predefined number of degrees about the Y axis in either a clockwise or a counter-clockwise direction. The precise tilt depends on the number of pulses and the voltage applied to the PZT. After translation of the specimen feature to the required tilt angle, the system requires no power to maintain gripping of the actuator arm. This is an important attribute of the invention since any power present can interfere with the analysis and/or imaging of the specimen.

By correcting for any non-linearity in the PZT actuation, highly linear positioning is possible. Used alone, PZT actuation has no intrinsic feedback control mechanism. Therefore, the preferred embodiment incorporates capacitive sensors into the actuator arms, which gives the user sub-nanometer control using a closed-loop positional feedback system. Capacitive sensors assist in correcting hysteresis and creep typically observed with PZT actuation under open-loop control. Other advantages of incorporating capacitive sensors are that they are intrinsically vacuum compatible, compact, insensitive to EMI and require no homing procedure.

By incorporating a support beam into the design, the angular tilt is restricted to approximately +/−25°, due to the limit to which torsion can be applied to the support beam. By repeatedly cycling the MEMS/PZT actuators between two fixed angles, for example between +15 and −15 degrees, and taking images at both angles, dynamic real-time stereo pairs are obtained.

One embodiment of the invention replaces the support beam with a pin-and-bearing arrangement. This alternative in combination with the MEMS/PZT actuators enables the specimen holder to be tilted through a complete 360°, which is essential for tomography applications for three-dimensional reconstruction of the specimen.

Finally, in the preferred design, the specimen cradle is capable of supporting standard 3.05 mm diameter metal grids. While this is the generally accepted method of mounting specimens for TEM analysis, the option of using silicon nitride or silicon dioxide membranes is also available. These membranes offer the electron microscopist a flatter substrate with an area not obscured by the presence of a grid pattern.

The advantages of this invention in terms of providing digital control to the TEM user as well as controlled and reproducible tilts about the Y axis are significant when attempting to obtain three-dimensional information using stereo-pairs or tomograms of a biological or materials-related specimen. These advantages will become apparent from the following detailed description and the accompanying drawings.

DETAILED DESCRIPTION OF THE INVENTION

The invention, described in detail below with respect to its preferred embodiment, can be incorporated into a side-entry single-tilt specimen holder for the purpose of imaging and analysis of specimens in a transmission electron microscope. It will be apparent to anyone with knowledge in the field of microscopy that the dynamically tilting MEMS/PZT-actuated holder can be adapted to fit into other types of electron and ion microscopes and can be used with both heating and cooling specimen holders.

Figure 1:
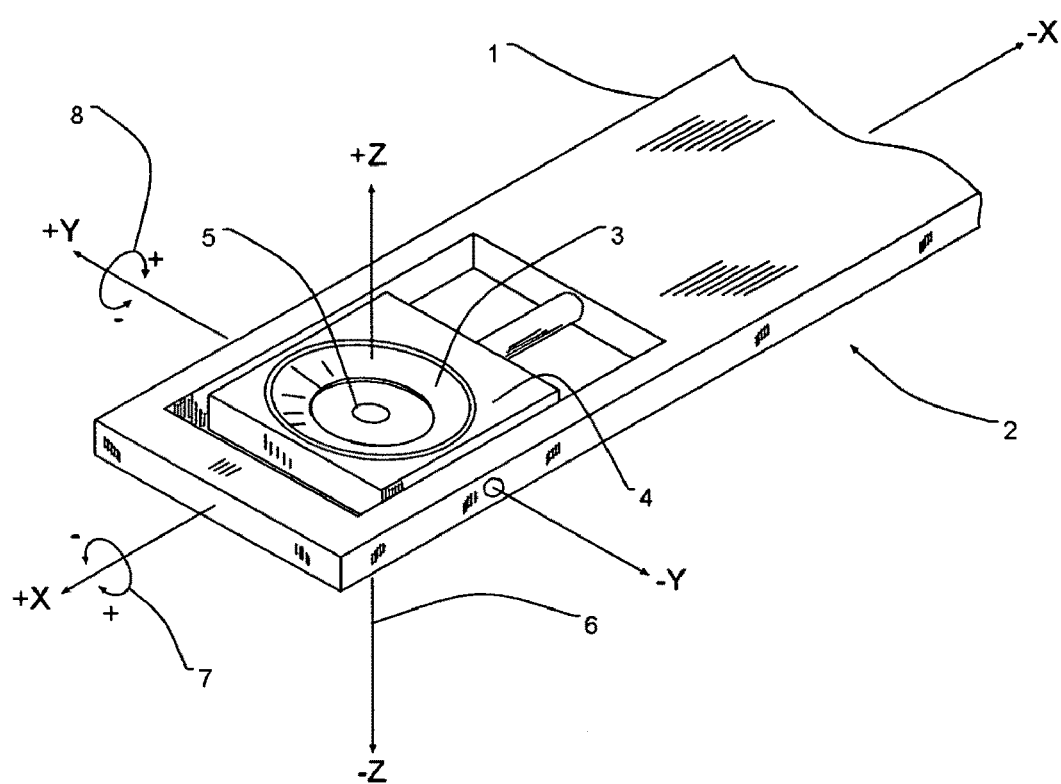
FIG. 1 is a schematic representation of the distal end of a single-tilt TEM specimen holder, illustrating the ability of the holder to tilt in two axes (longitudinal and perpendicular to longitudinal), as well as to translate the specimen in the X and Y axes about the Z axis, parallel to the electron beam.

With reference to FIG. 1 of the distal end 1 of a double-tilt specimen holder 2, a specimen cradle 3 held in a frame 4 contains a specimen 5, which has been previously prepared. Typically, specimens are mounted on a grid that is 25 to 45 micrometers in thickness, 3.05 mm in diameter and containing a mesh of varying size. Grids are often metallic, with the majority made of copper. Alternative grids include other metallic (such as nickel) and non-metallic (such as carbon) varieties. In order to suspend a specimen on such grids for viewing in the TEM, a thin (10 nm) carbon film or holey carbon film is placed over the mesh grid. More recently, silicon nitride and silicon dioxide membranes have become available. These also are 3.05 mm in diameter with a 50 to 200 micrometer substrate of silicon and with membranes ranging in thickness between seven and several hundred nanometers. These membranes have no grid, thereby offering a larger specimen area for imaging and allowing a higher tilt angle.

With reference to FIG. 1 showing the distal end 1 of a double-tilt specimen holder 2, the principal axes are X, Y and Z. Movements in either the positive (+) or negative (−) direction for each of these axes are shown by the directional arrows and represent the accepted nomenclature. The specimen 4 when mounted in the specimen cradle 3 can be raised or lowered in the Z axis direction 6 in order to obtain the ideal specimen height within the objective lens of the TEM. The ideal Z axis height is often associated with the optimum lens conditions for imaging or analysis. The X axis represents the longitudinal axis of the specimen holder 2. Rotating about the X axis 7 is commonly referred to as the α-tilt or as the X-axis tilt. This can be either in the clockwise (+) or counterclockwise (−) direction as indicated.

The Y axis is defined as the axis that is perpendicular to the longitudinal axis of the specimen holder 2. Secondary rotation about the Y axis 8 is commonly referred to as the β tilt or as the Y-axis tilt. This can be in either the clockwise (+) or counterclockwise (−) direction as indicated.

Figure 2:
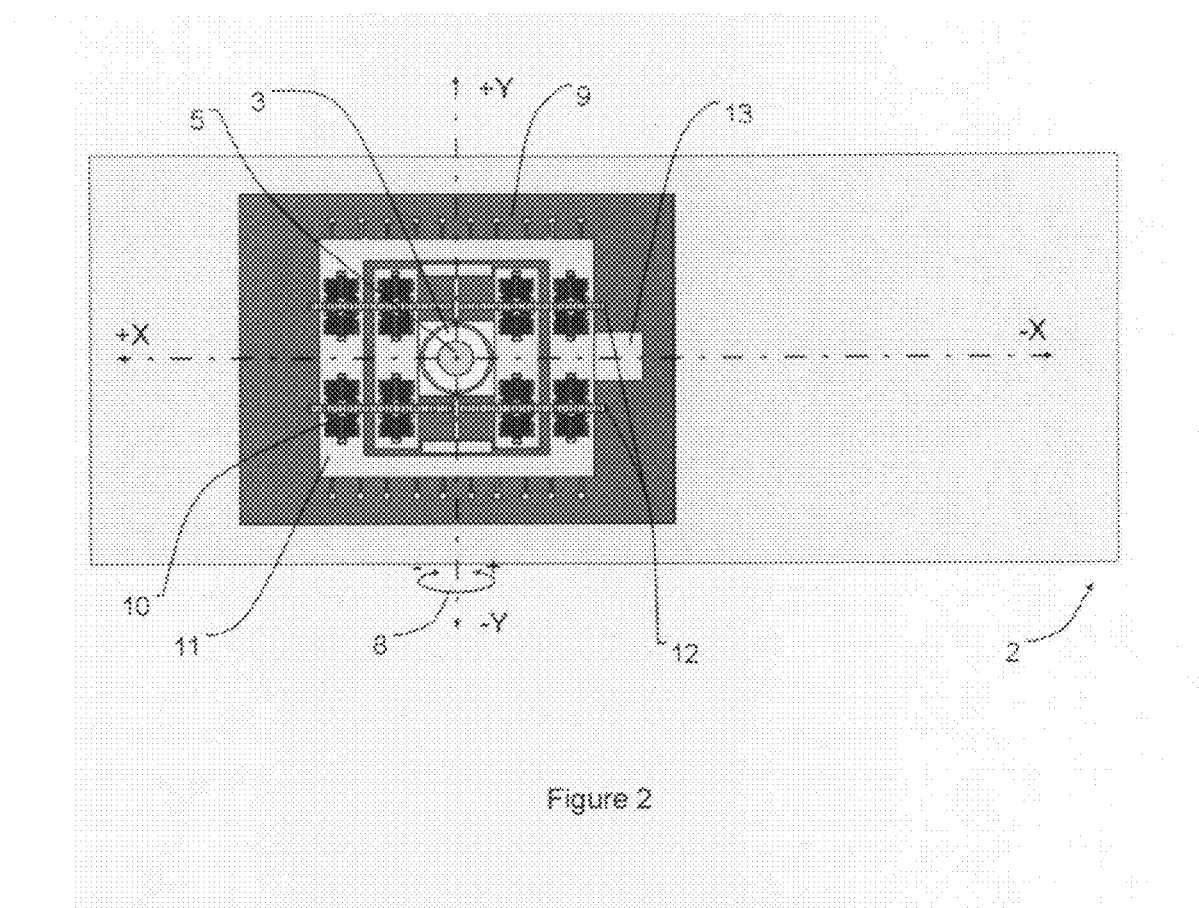
FIG. 2 is a topographical view of the dynamically tilting specimen holder, illustrating the arrangement of MEMS and PZT assemblies for tilting the specimen cradle.

While the design shown in FIG. 1 is typical of commercially available double-tilt holders, FIG. 2 shows the overall design for the preferred invention for integrating MEMS and PZT technology into a commercially available single-tilt specimen holder 2. In this configuration, the specimen 5 is mounted in the specimen cradle 3. The MEMS and PZT components are anchored to a fixed substrate 9. Rotation of the specimen about the Y axis 8 is achieved through a combination of MEMS clutches 10 mounted on a moveable platform 11, that is connected to two actuator arms 12 and a PZT drive 13.

Figure 3:
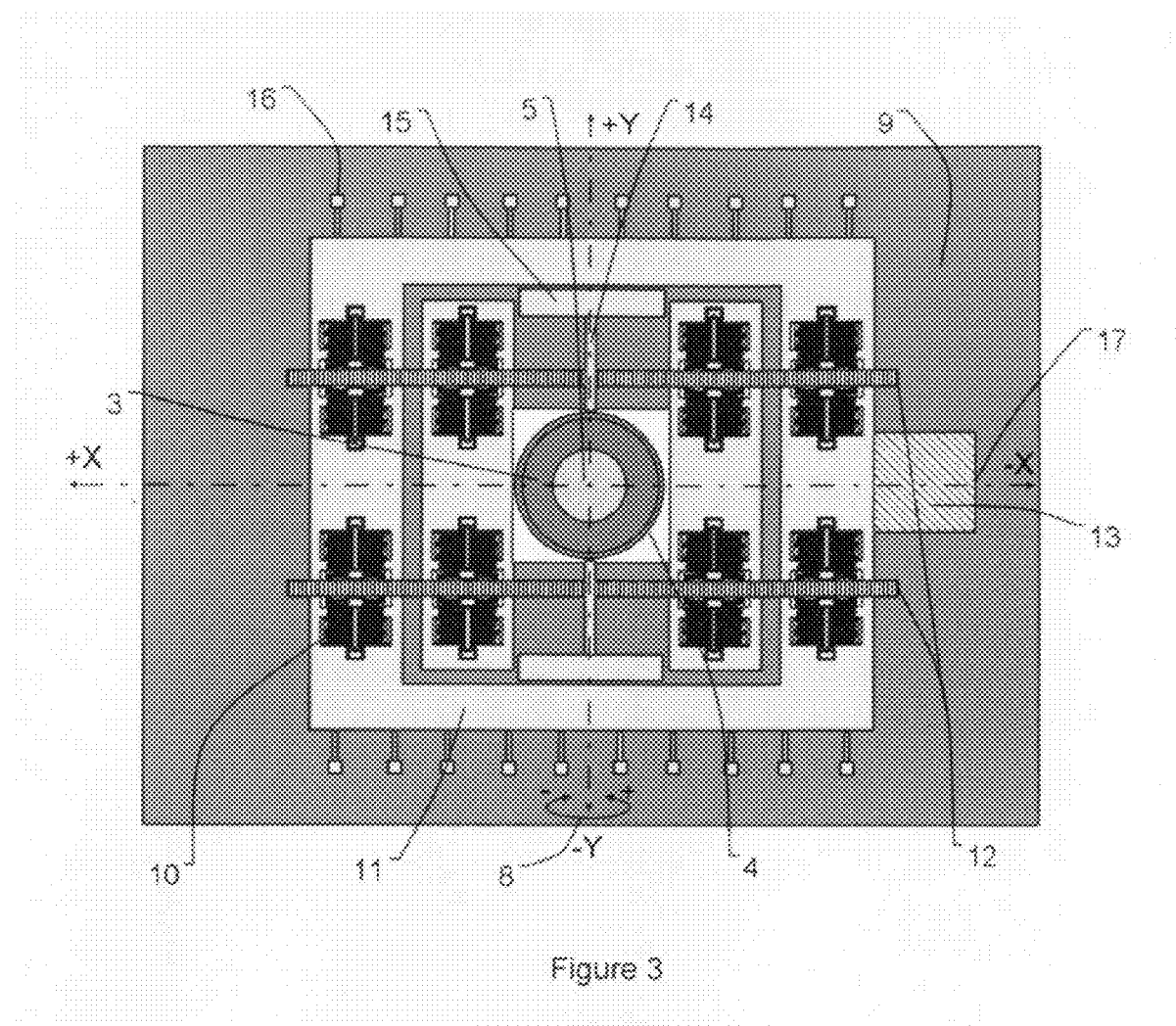
FIG. 3 is a topographical view illustrating the arrangement of MEMS and PZT assemblies where tilting of the specimen in the Y axis is achieved by applying torsion to a support beam via actuator arms moving in the +X/−X direction.

FIG. 3 shows the arrangement of the MEMS clutch assembly in relation to the PZT drive used for electromechanical displacement of the actuator arm. In this embodiment, the specimen 5, mounted in the specimen cradle 3 and frame 4, is held in place by a beam 14 and anchor 15 arrangement. In this design, four pairs of the MEMS clutches 10 are attached to a moveable platform 11 which is held off the fixed substrate 9 by flexible beams 16, giving frictionless motion (needed for obtaining nanometer movements) while restricting lateral movement, yet allowing the MEMS clutches to move in the longitudinal (+X/−X) direction as shown when the PZT drive 13 is actuated. In order to provide movement of the actuator arms 12 in the X axis, one end of the PZT drive 13 is adhered by its edge 17 to the substrate 9 and the other to the moveable platform 11. In this manner, with the correct orientation and by applying sufficient voltage to the PZT drive 13, it will move the MEMS clutches 10, attached to the moveable platform 11 back and forth. By sequentially gripping and releasing the MEMS clutches in concert with the PZT actuation, the actuator arms 12 can be made to translate in the +X or −X direction. Tilting of the specimen cradle 3 in the Y axis 8 is achieved by applying a torsional force to the beam 14 attached to the cradle frame 4 and anchor 15.

Figure 4:
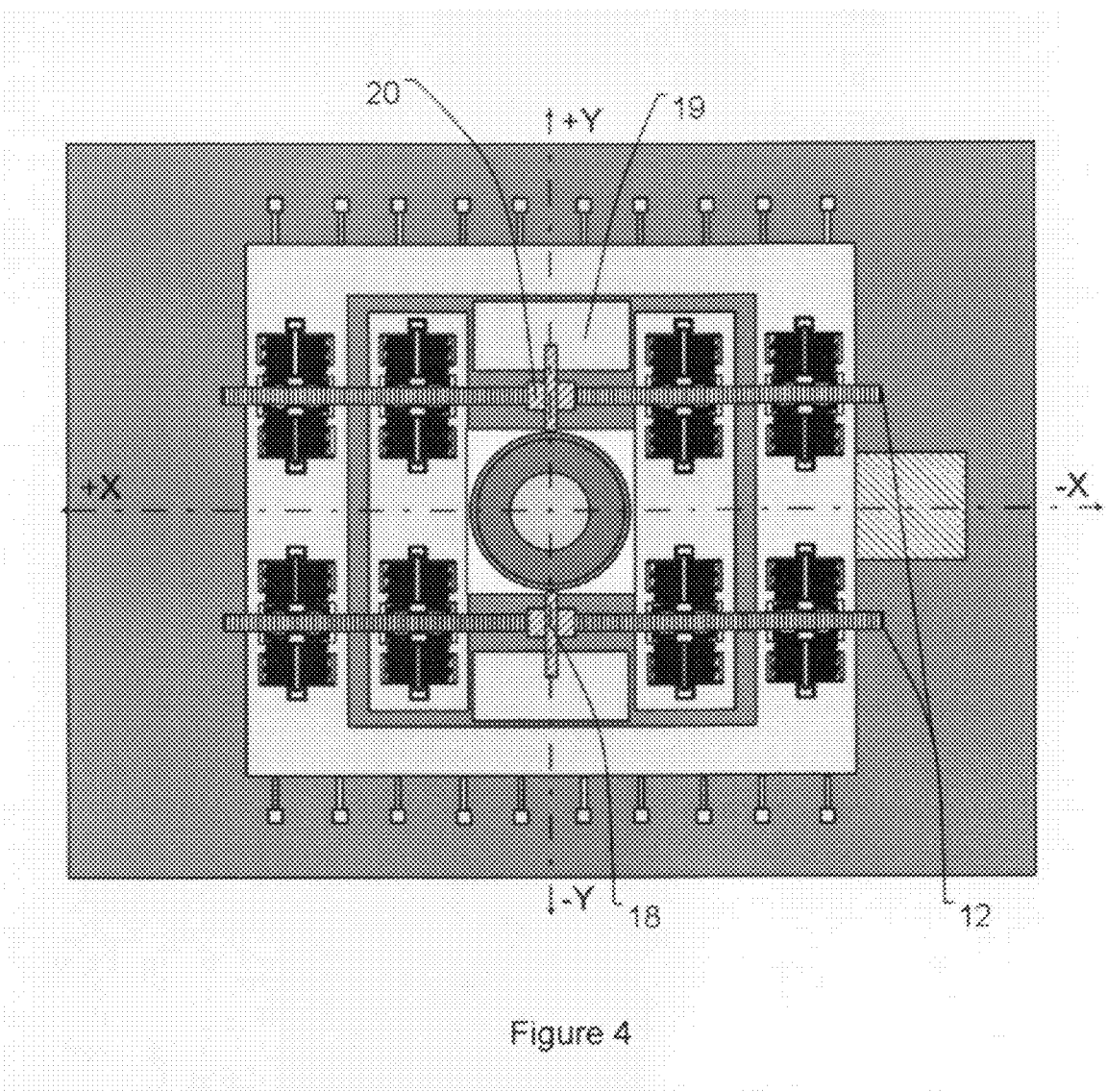
FIG. 4 is a topographical view illustrating the arrangement of MEMS and PZT assemblies where tilting of the specimen is achieved by rotation about the Y axis with a bearing and axle arrangement driven by a actuator arms moving in the +X/−X direction.

FIG. 4 is technically identical to FIG. 3 in its operation with one major difference. The beam 14 and anchor 15 of FIG. 3 are replaced by a pin 18 and axle 19 arrangement. The translation of the lateral motion of the actuator arms 12 is transferred to the pin 18 and axle 19 via a wheel 20.

Figure 5:
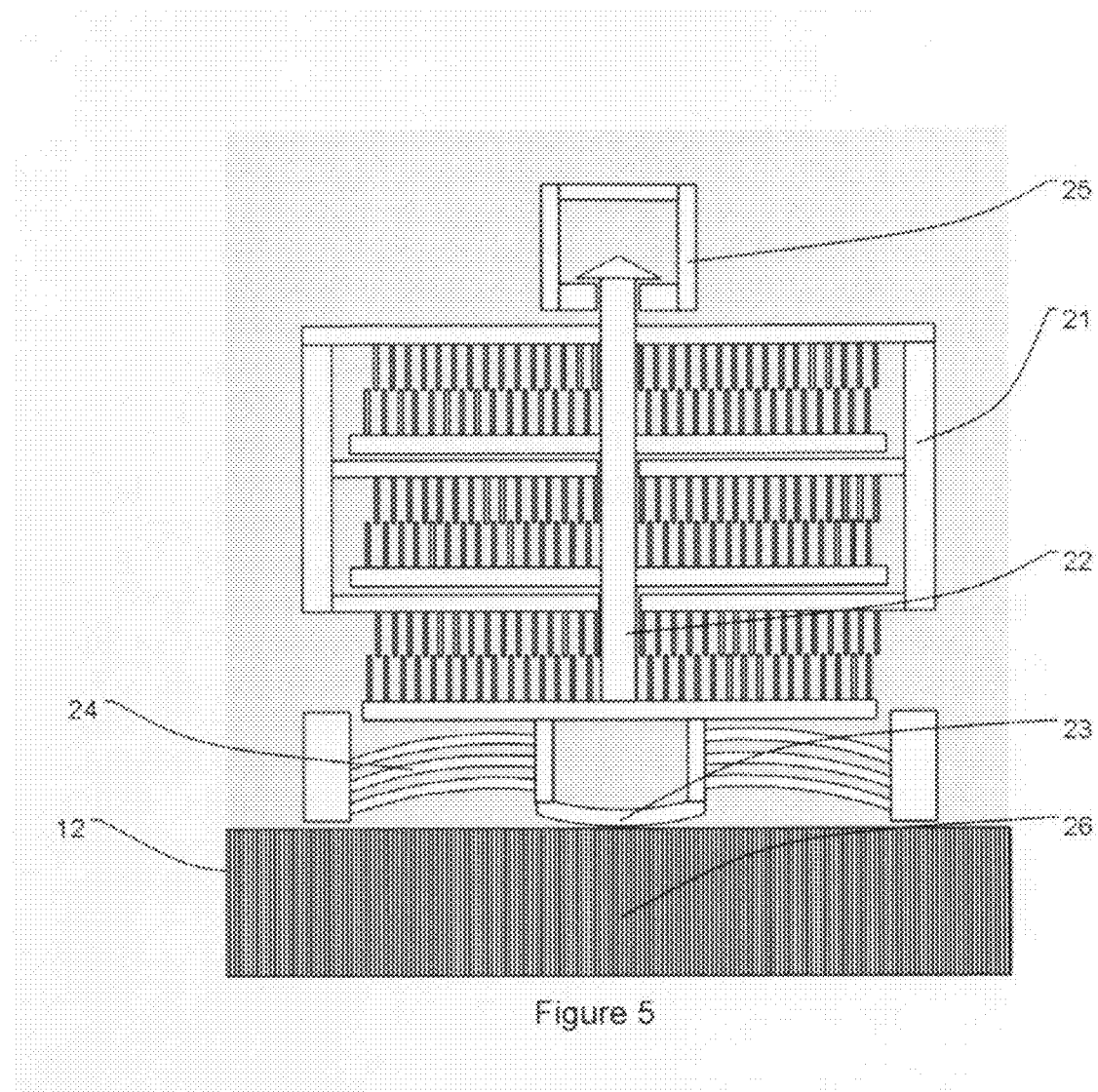
FIG. 5 is a detailed topographical view of a MEMS clutch unpowered, used to grip the actuator arm prior to PZT actuation for translation.

FIG. 5 shows a preferred form of the MEMS clutch in greater detail, consisting of a static 21 and a moving 22 comb drive. The actuator arm 12 is gripped at the edge by the MEMS clutch via a plate 23. The pressure to keep the actuator arm from moving is supplied by a series of MEMS micromachined springs 24. These springs are compressed and latched 25 prior to actuation of the MEMS comb drives. Micromachined features 26 are incorporated into the base of the actuator arm 12 to allow closed-loop capacitive sensing for sub-nm positional control of the actuator arm 12 in the +X/−X direction.

An important embodiment of the design is to prevent specimen drift and movement as well as ensure minimal RF interference near the specimen during imaging and analysis. In order to achieve this, as shown in FIG. 5, the MEMS clutch plate 23 grips the actuator arm 12 in the unpowered state.

Figure 6:
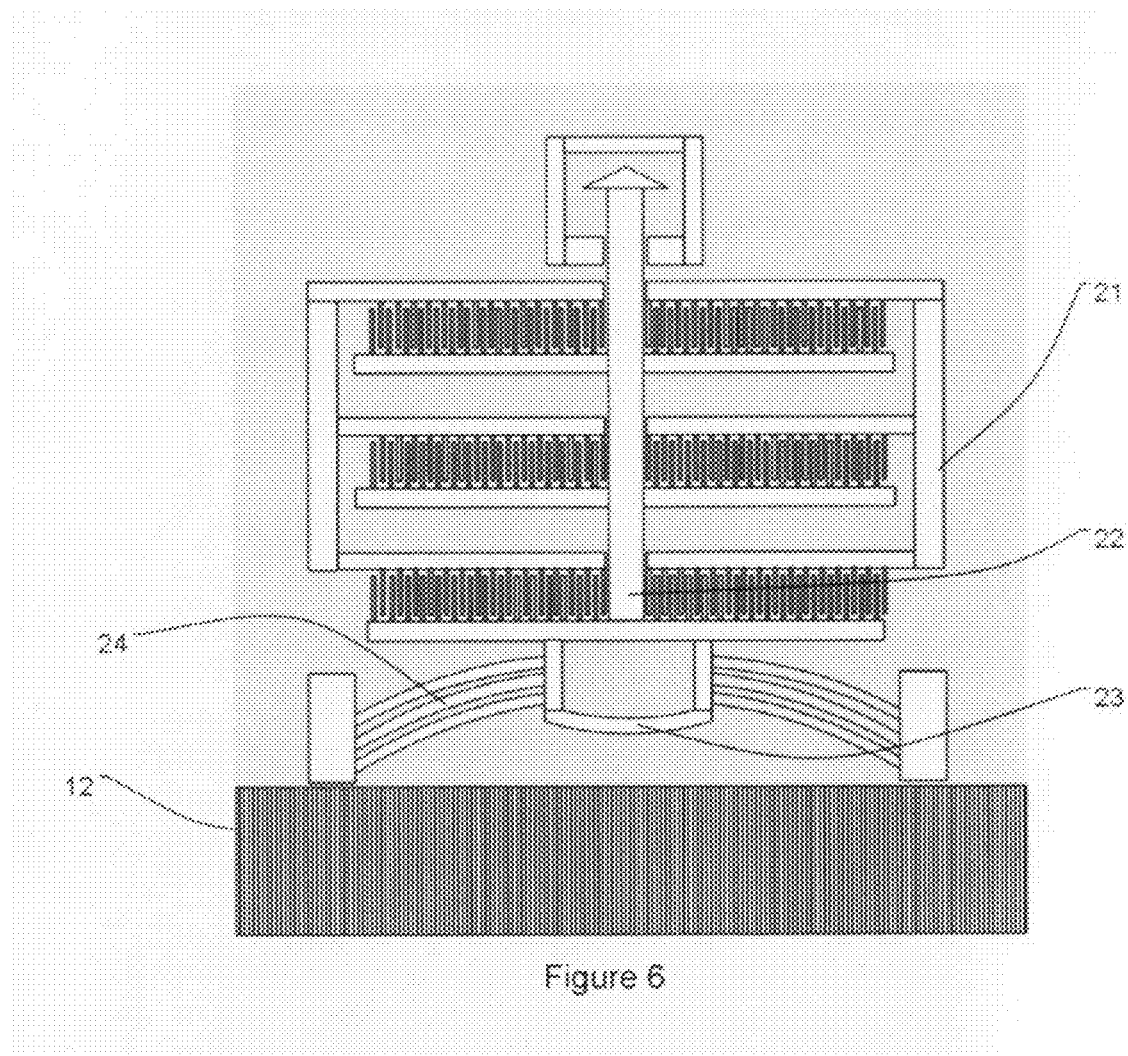
FIG. 6 is a detailed topographical view of a MEMS clutch in the powered state with the grip on the actuator arm removed.

FIG. 6 shows the detailed MEMS clutch in the powered mode where the MEMS clutch plate 23 is retracted from the actuator arm 12. As is well known in the art of MEMS comb drive design, this is achieved by applying opposite electrical charges to the comb drive so that attractive forces pull the moving shuttle 22 toward the fixed comb drive 21, against the restoring force of the MEMS springs 24. The design of the comb drives (such as the number of combs and their physical dimensions) will have an impact on the actuation force and are optimized in such a manner as to overcome the force of the MEMS springs 24 and any friction associated with the action of the MEMS clutch assembly.

FIGS. 7 through 11 show one cycle of the MEMS/PZT actuators to illustrate how they give rise to tilting of the specimen.

Figure 7:
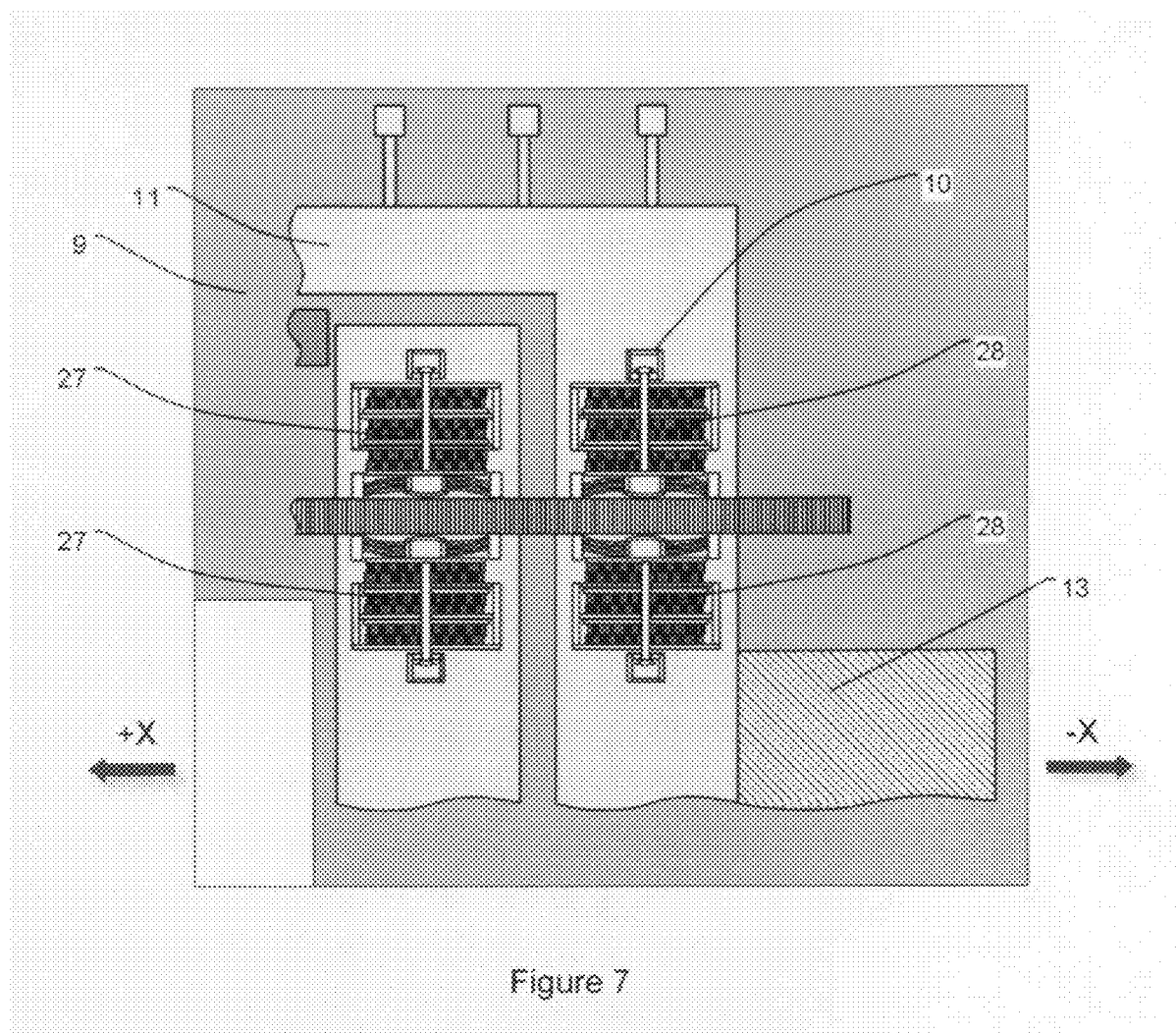
FIG. 7 is a partial, detailed topographical illustration showing the unpowered MEMS clutch assembly for translating the actuator arms in the +X and −X directions by activating the PZT drive with four clutches gripping the edge of each actuator arm.

FIG. 7 shows in more detail four of the MEMS clutches 10 in the unpowered state. Two of the MEMS clutches 27 are attached directly to the fixed substrate 9 while the remaining two MEMS clutches 28 and the PZT drive 13 are attached to a moveable platform 11.

Figure 8:
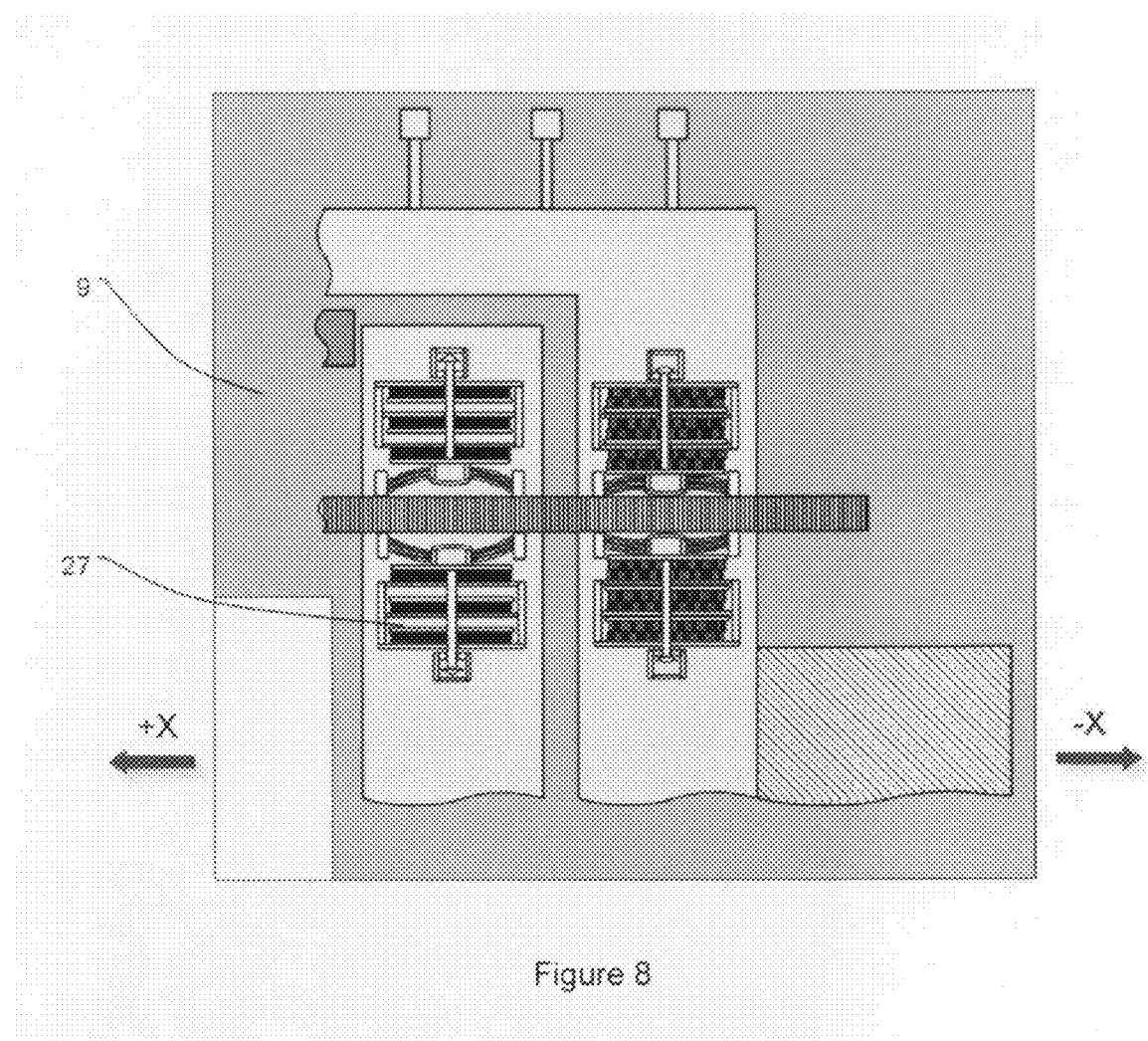
FIG. 8 is a partial, detailed topographical illustration showing power applied to one pair of MEMS clutches that releases the actuator arm for movement in the +X or −X direction with PZT drive actuation.

FIG. 8 shows power applied to the two MEMS clutches 27 attached directly to the fixed substrate 9.

Figure 9:
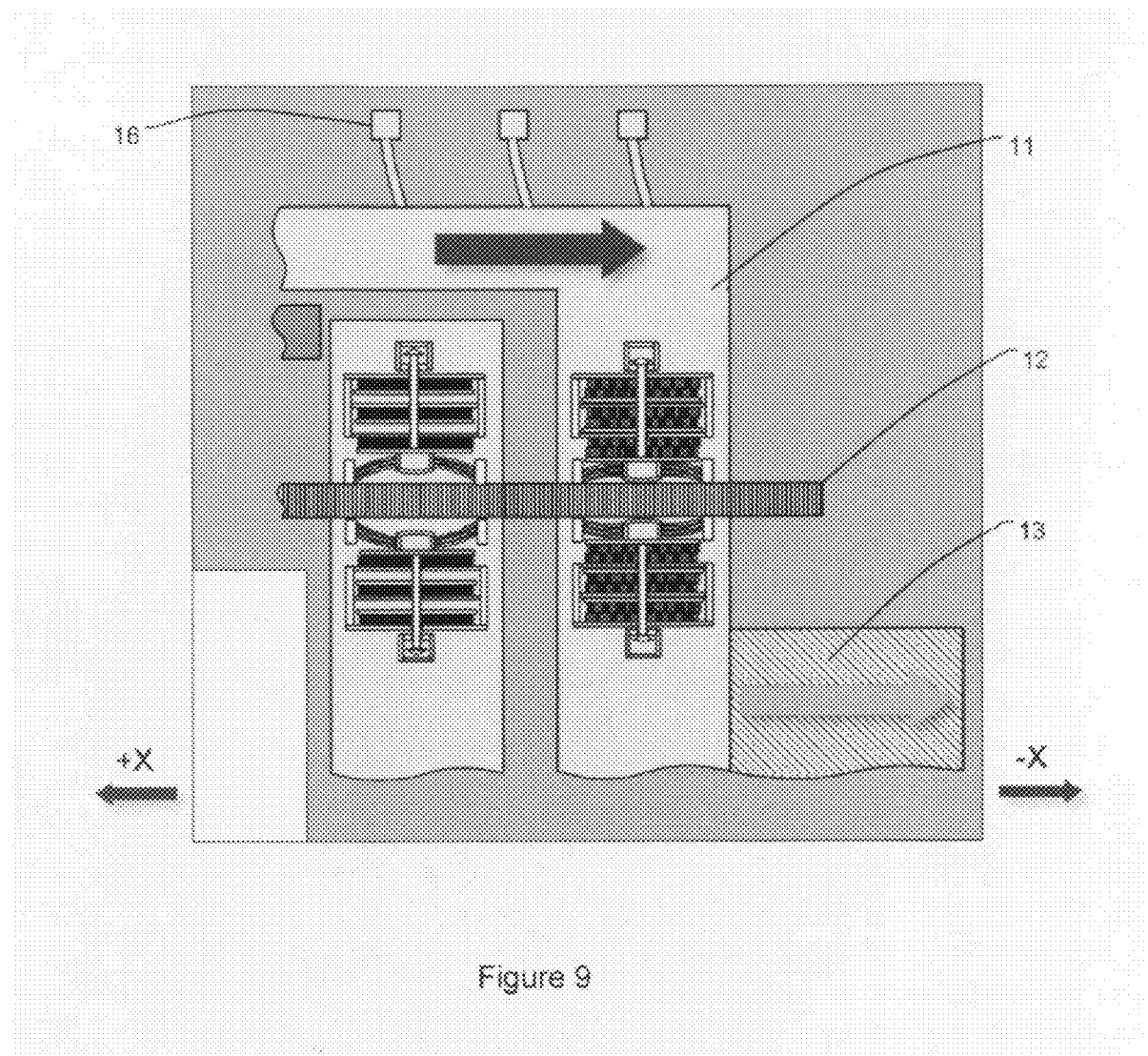
FIG. 9 is a partial, detailed topographical representation of the activation of the PZT drive, promoting movement of the actuator arm in the −X direction.

FIG. 9 shows power applied to the PZT drive 13 to cause translation in the −X direction. This simultaneously gives rise to translation of the moveable platform 11 and the actuator arm 12 in the −X direction to cause tilting of the specimen in the minus direction about the Y axis. The translation of the moveable platform 11 also causes bending of the flexible beams 16.

Figure 10:
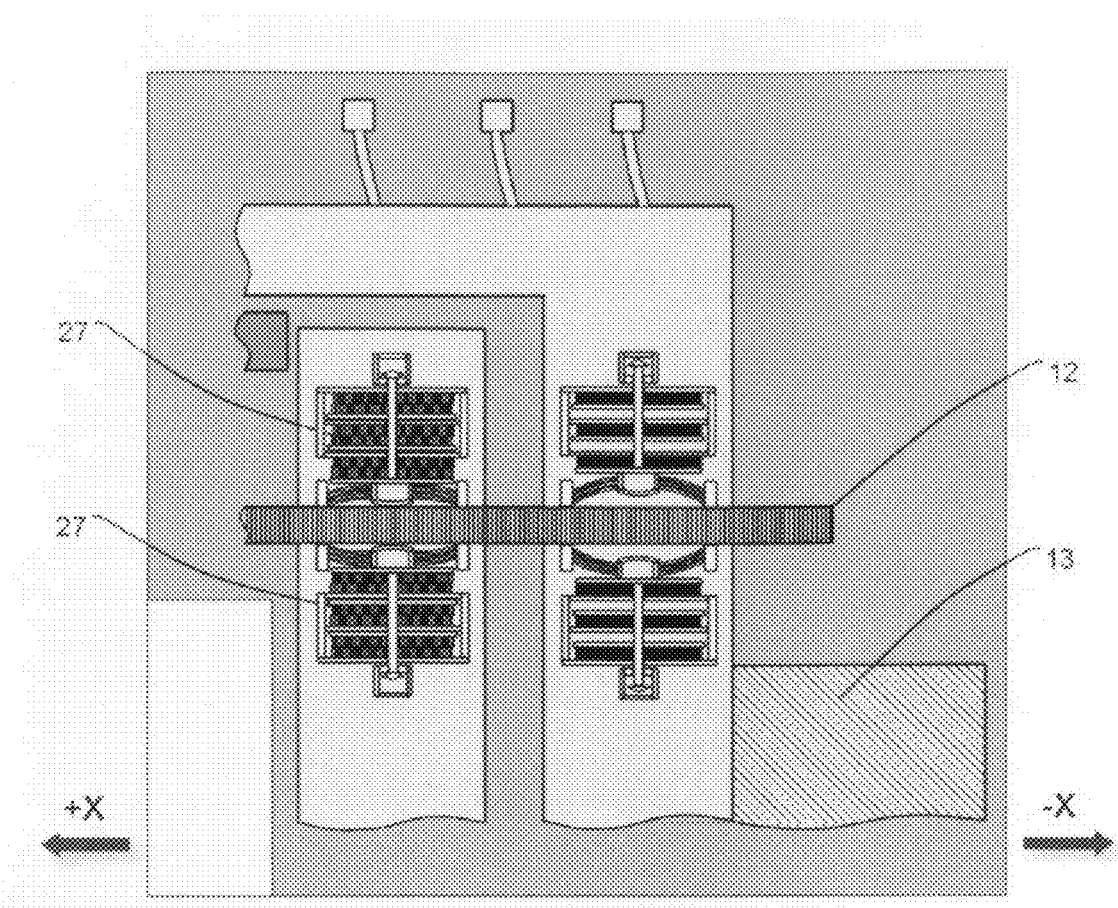
FIG. 10 is a partial, detailed topographical representation following movement of the actuator arm in the −X direction. In this figure, power is removed from one pair of fixed MEMS clutches to re-establish a grip on the actuator arm. Applying power to the remaining pair of MEMS clutches prepares the assembly to be reset prior to another cycle.

FIG. 10 shows power to each of the four MEMS clutches reversed so that one pair of MEMS clutches 27 re-establishes a grip on the actuator arm 12 prior to reversal of the PZT driver 13 displacement.

Figure 11:
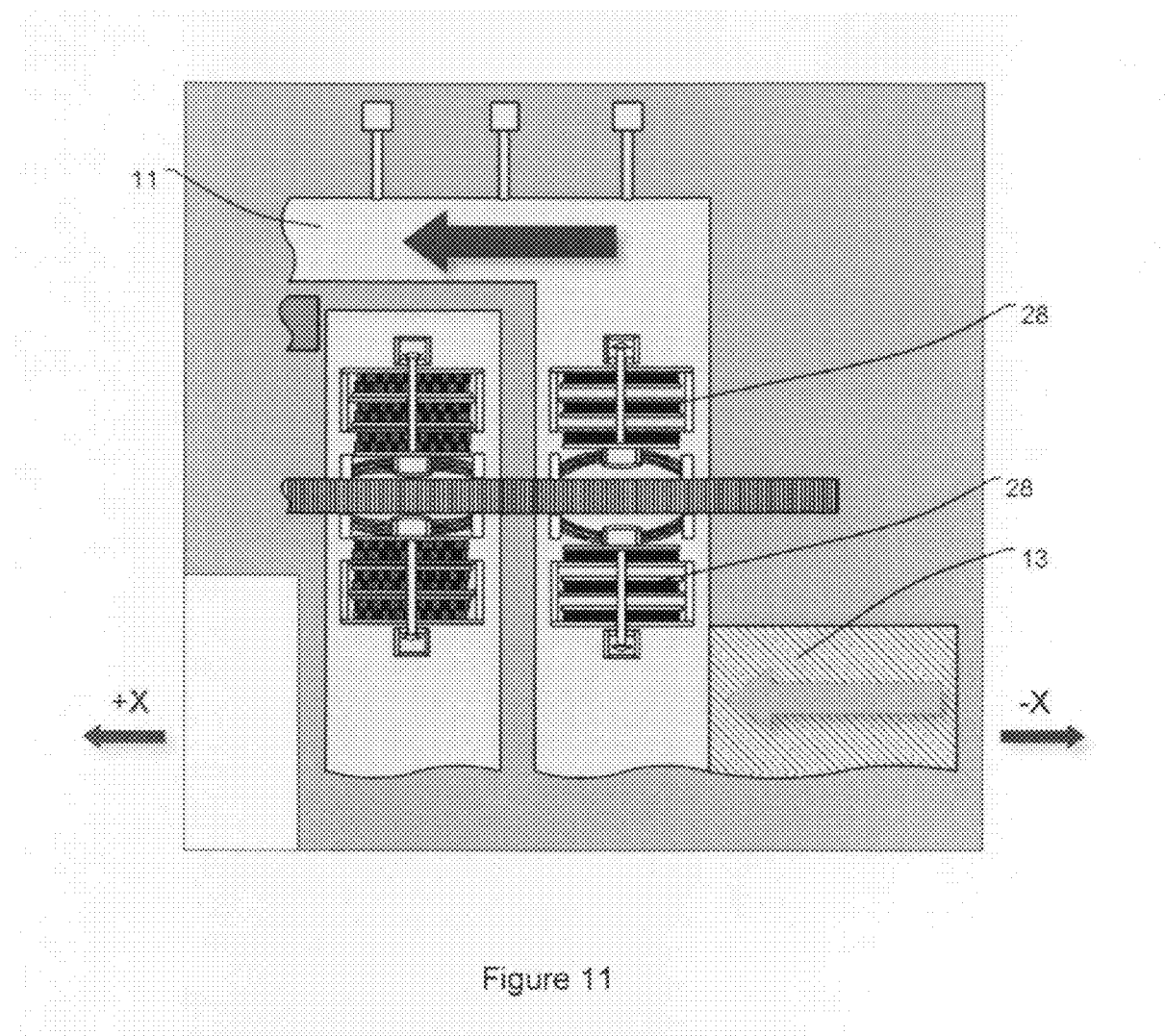
FIG. 11 is a partial, detailed topographical representation of applying power to the PZT drive to reset the MEMS clutch assembly by moving it in the +X direction in readiness for the next cycle in either the +X or −X direction.

FIG. 11 shows the final movement of the PZT driver 13 to return the moveable platform 11 and its associated MEMS clutches 28 back to their starting position in preparation for the next cycle.

By reversing the direction of the PZT drive through applying an opposite bias voltage, the moveable platform will be translated in the +X direction, thereby causing the specimen cradle to rotate in the opposite direction about the Y axis. The magnitude of the rotation is directly proportional to the voltage applied to the PZT driver and can range from nanometers to micrometers for each actuation cycle. FIGS. 7 through 11 show the sequence of resetting the individual MEMS clutches prior to applying another tilt of the specimen cradle in either the +Y or −Y direction about the Y axis. By repeating the procedure, the specimen can be tilted in discrete steps determined by the voltage applied to the PZT drive and by the number of times this process is repeated. In the case where the design utilizes a beam and anchor (FIG. 3), the rotation is limited to about +/−25 degrees due to the maximum torsional stress that can be applied to the beam. While this design gives sufficient angular tilt, accuracy and speed for real-time stereo imaging, the limited angular range is not sufficient for collecting tomograms that require a larger tilt angle. In order to achieve the latter, it is necessary to incorporate a pin, axle and wheel (FIG. 4) arrangement so that with sufficient translation of the actuator arms, the specimen cradle can be rotated 360 degrees in principle, assuming there is an adequate gap in the objective lens pole piece.

By utilizing MEMS and PZT technology in the dynamically tilting TEM specimen holder, the speed and displacement can be measured and controlled digitally and are therefore programmable, and thus can be integrated into software. This offers the user the advantage of directly interfacing between an image and the tilt angle of the specimen cradle. By integrating closed-loop capacitive feedback sensors in the actuator arms, precise holder tilts can be achieved.

Besides providing for real-time stereo imaging and tomography capability, this invention also enables zero loss images to be calculated from the collection of a time series of stereo pair images so that image correlation analysis can be used to reconstruct an image to a point in time prior to any electron beam damage, should it occur. These methods are particularly relevant when attempting to image electron beam-sensitive specimens such as polymers and biological materials. One final embodiment of the invention allows for the possibility of auto crystal alignment in which a crystalline specimen of a chosen crystal plane may be automatically aligned to the electron beam to enhance imaging capability or improve the contrast of the specimen.

While certain representative embodiments and details have been shown for the purpose of illustrating the invention, it will be apparent to those skilled in the art that various changes in the methods and apparatus disclosed herein may be made without departing from the scope of the invention.

In principal, an embodiment using PZTs alone, or an embodiment using MEMS alone, could perform a similar function to the combined use of PZTs and MEMS; however, either embodiment would have disadvantages. In the case of PZTs, there is a potential need to apply constant power to them to grip the actuator arms. The application of constant power to the PZTs could interfere with imaging, especially at high resolution, due to mechanically- and/or electrically-derived vibration as well as from potential uncontrollable movement of the specimen. In the case of MEMS alone, the forces generated by the MEMS components are likely to be insufficient for gripping the actuator arms and tilting the specimen cradle in its frame. Hence, the preferred embodiment as described herein utilizes a combination of PZTs and MEMS.

What is claimed is:

1. A side-entry dynamically tilting specimen holder capable of tilting or rotating about the X and Y axes for use in a transmission electron microscope (TEM), comprised of:
    A specimen stage that translates the specimen holder in the Z direction and tilts it about the X axis;
    A specimen holder frame that can be independently tilted or rotated about the Y axis;
    A specimen cradle held in said specimen frame;
    Actuator arms plus micromachined components, MEMS comb drive actuators, or PZTs; or a combination of micromachined components, PZTs and MEMS actuators for partially tilting or continuously rotating said specimen frame about the Y axis; and,
    Closed-loop capacitive feedback sensors for sub-nanometer positional control incorporated into said actuator arms and into a fixed-substrate that supports the said assemblies.

2. A specimen holder as described in claim 1 where partial tilting about the Y axis is achieved via torsional motion of a support beam pushed or pulled by one or more said actuator arm(s).

3. A specimen holder as described in claim 1 where continuous rotating about the Y axis is achieved by an axle held in a bearing with rotation provided by one or more translating micromachined actuator arm(s).

4. A specimen holder as described in claim 1 in which a number of said micromachined components incorporate springs and levers to mechanically grip the micromachined actuator arm(s).

5. A specimen holder as described in claim 1 in which a number of said micromachined components release the grip on said micromachined actuator arm(s) when power is applied to an actuator, for example a PZT drive.

6. A specimen holder as described in claim 1 in which a number of said MEMS actuators are utilized to mechanically grip the micromachined actuator arm(s).

7. A specimen holder as described in claim 1 in which a number of said MEMS actuators incorporate thermal actuators to mechanically grip the micromachined actuator arm(s).

8. A specimen holder as described in claim 1 in which a number of said PZT actuators grip mechanically the actuator arm(s).

9. A specimen holder as described in claim 1 incorporating a moveable platform supporting said micromachined, MEMS and/or PZT actuators to which flexible beams are attached to allow frictionless motion and restrict the lateral movement of the assembly.

10. A specimen holder as described in claim 1 incorporating a fixed substrate supporting said micromachined, MEMS and/or PZT actuators.

11. A specimen holder in which said moveable platform is translated in the +X and −X directions via a PZT and/or MEMS-type actuator, which in turn leads to inchworm-like movement of the micromachined actuator arm(s), resulting in rotation of the specimen cradle about the Y axis as described in claim 1.

\* \* \* \* \*